(12) United States Patent
Nishioka et al.

(10) Patent No.: US 11,631,535 B1
(45) Date of Patent: Apr. 18, 2023

(54) LONGITUDINAL SENSOR BIAS STRUCTURES AND METHOD OF FORMATION THEREOF

(71) Applicant: Western Digital Technologies, Inc., San Jose, CA (US)

(72) Inventors: Masaya Nishioka, San Jose, CA (US); Diane L. Brown, San Jose, CA (US); Jianhua Hu, Palo Alto, CA (US); Cherngye Hwang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/495,994

(22) Filed: Oct. 7, 2021

(51) Int. Cl.
| | |
|---|---|
| *H01F 41/14* | (2006.01) |
| *H01F 10/14* | (2006.01) |
| *C23C 14/34* | (2006.01) |
| *G11B 5/33* | (2006.01) |
| *G11B 5/31* | (2006.01) |
| *G11B 5/39* | (2006.01) |

(52) U.S. Cl.
CPC ............. *H01F 41/14* (2013.01); *C23C 14/34* (2013.01); *H01F 10/14* (2013.01); *G11B 5/3163* (2013.01); *G11B 5/33* (2013.01); *G11B 5/3932* (2013.01); *G11B 2220/90* (2013.01)

(58) Field of Classification Search
None
See application file for complete search history.

(56) References Cited

U.S. PATENT DOCUMENTS

| | | | |
|---|---|---|---|
| 4,604,176 A | * | 8/1986 | Paul ........................ H01F 41/18 427/128 |
| 5,745,978 A | | 5/1998 | Aboaf et al. |
| 7,038,892 B2 | | 5/2006 | Chau et al. |
| 8,333,898 B2 | | 12/2012 | Brown et al. |
| 9,947,344 B2 | | 4/2018 | Biskeborn et al. |

(Continued)

FOREIGN PATENT DOCUMENTS

| | | | | |
|---|---|---|---|---|
| CN | 104851550 A | * | 8/2015 | ............. B82Y 25/00 |
| CN | 105448463 A | * | 3/2016 | ......... H01F 10/3272 |

(Continued)

OTHER PUBLICATIONS

Biskeborn, Robert G. et al., "TMR Tape Drive for a 15 TB Cartridge", AIP Advances, vol. 8, Issue 5, Dec. 2017, pp. 1-21, https://doi.org/10.1063/1.5007788.

*Primary Examiner* — William J Klimowicz
(74) *Attorney, Agent, or Firm* — Patterson + Sheridan, LLP; Steven H. VerSteeg

(57) ABSTRACT

The present disclosure generally relates to a storage device comprising soft bias structures having high coercivity and high anisotropy, and a method of forming thereof. The soft bias structures may be formed by moving a wafer in a first direction under a plume of NiFe to deposit a first NiFe layer at a first angle, moving the wafer in a second direction anti-parallel to the first direction to deposit a second NiFe layer at a second angle on the first NiFe layer, and repeating one or more times. The soft bias structures may be formed by rotating a wafer to a first position, depositing a first NiFe layer at a first angle, rotating the wafer to a second position, depositing a second NiFe layer at a second angle on the first NiFe layer, and repeating one or more times. The first and second NiFe layers have different grain structures.

7 Claims, 7 Drawing Sheets

(56) References Cited

U.S. PATENT DOCUMENTS

| | | | |
|---|---|---|---|
| 9,997,180 B1 | 6/2018 | Biskeborn et al. | |
| 10,580,442 B2 | 3/2020 | Biskeborn et al. | |
| 11,437,061 B1* | 9/2022 | Le | G11B 5/3912 |
| 2008/0063901 A1* | 3/2008 | Nakayama | G11B 5/84 |
| | | | 428/827 |
| 2009/0091856 A1* | 4/2009 | Honda | G11B 5/00826 |
| | | | 428/832 |
| 2010/0133090 A1* | 6/2010 | Endo | C23C 14/225 |
| | | | 204/192.15 |
| 2017/0092303 A1* | 3/2017 | Jiang | G11B 5/315 |
| 2017/0194023 A1* | 7/2017 | Okawa | G11B 5/398 |

FOREIGN PATENT DOCUMENTS

| | | | | | |
|---|---|---|---|---|---|
| CN | 106504891 A | * | 3/2017 | | H01F 10/145 |
| CN | 107841716 B | * | 11/2019 | | C23C 14/14 |
| CN | 112652436 A | * | 4/2021 | | |
| CN | 113227814 A | * | 8/2021 | | B82Y 25/00 |
| EP | 1434198 B1 | * | 9/2006 | | G11B 5/66 |
| EP | 2586889 A1 | * | 5/2013 | | C23C 14/34 |
| JP | 58050628 A | * | 3/1983 | | C23C 14/0021 |
| JP | 63113928 A | * | 5/1988 | | H01F 10/3272 |
| JP | 03265105 A | * | 11/1991 | | B82Y 25/00 |
| JP | H0897034 A | * | 4/1996 | | C23C 14/14 |
| JP | H10334441 A | * | 12/1998 | | |
| JP | 5320815 B2 | * | 10/2013 | | C23C 14/0605 |

* cited by examiner

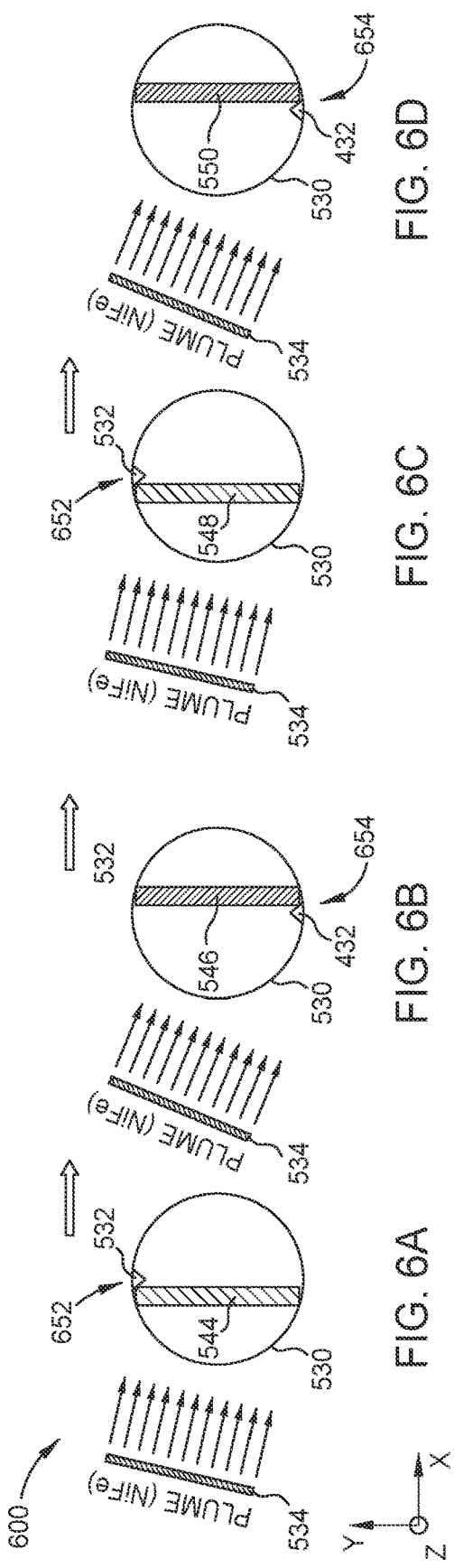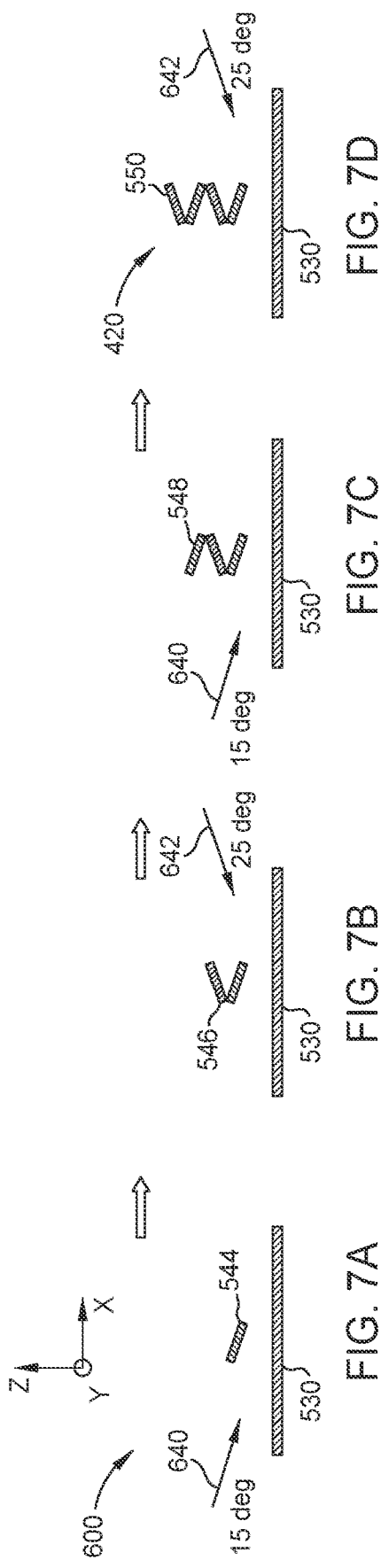

LONGITUDINAL SENSOR BIAS STRUCTURES AND METHOD OF FORMATION THEREOF

BACKGROUND OF THE DISCLOSURE

Field of the Disclosure

Embodiments of the present disclosure generally relate to a storage device comprising soft bias structures having high coercivity and high anisotropy, and a method of forming the soft bias structures.

Description of the Related Art

Various storage devices utilize biasing structures to ensure accurate reading and writing of data from/to medias. For example, tape data storage is a system for storing digital information on magnetic tape using digital recording. Tape drives operate by using a tape head to record and read back information from tapes by magnetic processes. The tape head can have servo elements and data elements that are arranged in an array that is oftentimes referred to as a tape head array.

Hard bias structures adjacent sensors in tape drives and other storage devices, such as hard disk drives (HDDs) can involve a high coercivity, which can hinder device performance. Soft bias structures generally involve a lower coercivity but may be unstable and can even move during operation of the tape drive.

Therefore, there is a need in the art for storage devices having soft bias structures that have high anisotropy to provide magnetic field stability to bias sensors.

SUMMARY OF THE DISCLOSURE

The present disclosure generally relates to a storage device comprising soft bias structures having high coercivity and high anisotropy, and a method of forming thereof. The soft bias structures may be formed by moving a wafer in a first direction under a plume of NiFe to deposit a first NiFe layer at a first angle, moving the wafer in a second direction anti-parallel to the first direction to deposit a second NiFe layer at a second angle on the first NiFe layer, and repeating one or more times. The soft bias structures may be formed by rotating a wafer to a first position, depositing a first NiFe layer at a first angle, rotating the wafer to a second position, depositing a second NiFe layer at a second angle on the first NiFe layer, and repeating one or more times. The first and second NiFe layers have different grain structures.

In one embodiment, a method of forming soft bias structures comprises moving a wafer a first direction under a plume of NiFe to deposit a first NiFe layer on a surface of the wafer, the first NiFe layer being deposited at a first angle with respect to the surface of the wafer, and moving the wafer a second direction opposite the first direction under the plume of NiFe to deposit a second NiFe layer on the first NiFe layer, the second NiFe layer being deposited at a second angle with respect to the surface of the wafer.

In another embodiment, a method of forming soft bias structures comprises (a) rotating and aligning a wafer to a first position, (b) depositing a first NiFe layer having a first grain structure on a surface of the wafer while the wafer is in the first position, the first NiFe layer being deposited at first angle with respect to the surface of the wafer, (c) rotating and aligning the wafer to a second positon, (d) depositing a second NiFe layer having a second grain structure on the first NiFe layer while the wafer is in the second position, the second NiFe layer being deposited at a second angle with respect to the surface of the wafer, and (e) repeating (a)-(d) one or more times to deposit one or more additional layers having alternating first and second grain structures on the second NiFe layer.

In yet another embodiment, a magnetic sensor comprises soft bias structures, wherein: the soft bias structures comprise one or more pairs of a first NiFe layer and a second NiFe layer disposed on the first NiFe layer, the first NiFe layer is deposited at a first angle with respect to a wafer surface from a first direction and has a first grain structure, the second NiFe layer is deposited at a second angle with respect to the wafer surface from a second direction and has a second grain structure different than the first grain structure, and the first direction is different than the second direction.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 6A-6D and 7A-7D illustrate a schematic second deposition technique for forming the side shields of the magnetic recording head of FIGS. 4A-4B, according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a storage device comprising soft bias structures having high coercivity and high anisotropy, and a method of forming thereof. The soft bias structures may be formed by moving a wafer in a first direction under a plume of NiFe to deposit a first NiFe layer at a first angle, moving the wafer in a second direction anti-parallel to the first direction to deposit a second NiFe layer at a second angle on the first NiFe layer, and repeating one or more times. The soft bias structures may be formed by rotating a wafer to a first position, depositing a first NiFe layer at a first angle, rotating the wafer to a second position, depositing a second NiFe layer at a second angle on the first NiFe layer, and repeating one or more times. The first and second NiFe layers have different grain structures.

It is to be understood that the magnetic recording head discussed herein is applicable to a data storage device such as a hard disk drive (HDD) as well as a tape drive, such as a tape embedded drive (TED) or an insertable tape media drive. An example TED is described in co-pending patent application entitled "Tape Embedded Drive", U.S. patent application Ser. No. 16/365,034, filed Mar. 31, 2019 and assigned to the same assignee of the instant application. Any reference in the detailed description to a HDD or tape drive is merely for exemplification purposes and is not intended to limit the disclosure unless explicitly claimed. Furthermore, reference to or claims directed to magnetic recording devices are intended to include both HDD and tape drive unless HDD or tape drive devices are explicitly claimed.

It is to be understood that embodiments described herein is not limited to a single dual free layer (DFL) read head and may be applicable to a two-dimensional magnetic recording (TDMR) DFL read head.

Figure 1:
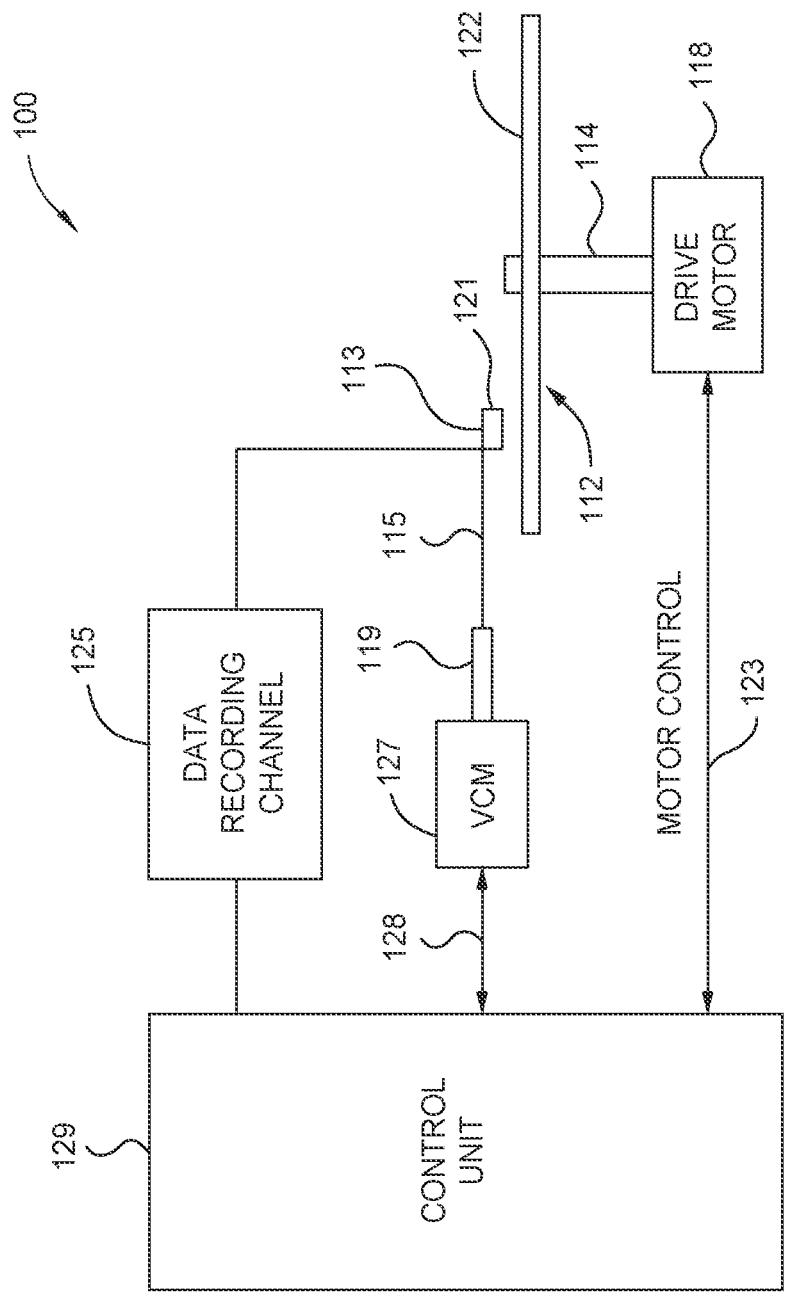
FIG. 1 is a schematic illustration of a magnetic media drive including a magnetic write head and a magnetic read head, according to various embodiments.

FIG. 1 is a schematic illustration of a magnetic media drive 100 including a magnetic write head and a magnetic read head, according to disclosed embodiments. The magnetic media drive 100 may be a single drive/device or comprise multiple drives/devices. The magnetic media drive 100 includes a magnetic recording medium, such as one or more rotatable magnetic media 112 supported on a spindle 114 and rotated by a drive motor 118. For the ease of illustration, a single disk drive is shown according to one embodiment. The magnetic recording on each magnetic media 112 is in the form of any suitable patterns of data tracks, such as annular patterns of concentric data tracks (not shown) on the magnetic media 112.

The slider 113 is positioned near the magnetic media 112. In some embodiments, the slider 113 is a plurality of sliders, where each slider 113 of the plurality of sliders supports one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the magnetic disk drive 100, the rotation of the magnetic media 112 generates an air bearing between the slider 113 and the media surface 122 which exerts an upward force or lift on the slider 113. The air bearing thus counter-balances the slight spring force of suspension 115 and supports slider 113 off and slightly above the magnetic media 112 surface by a small, substantially constant spacing during normal operation.

The various components of the magnetic disk drive 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position the slider 113 to the desired data track on the magnetic media 112. Write and read signals are communicated to and from write and read heads on the magnetic head assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
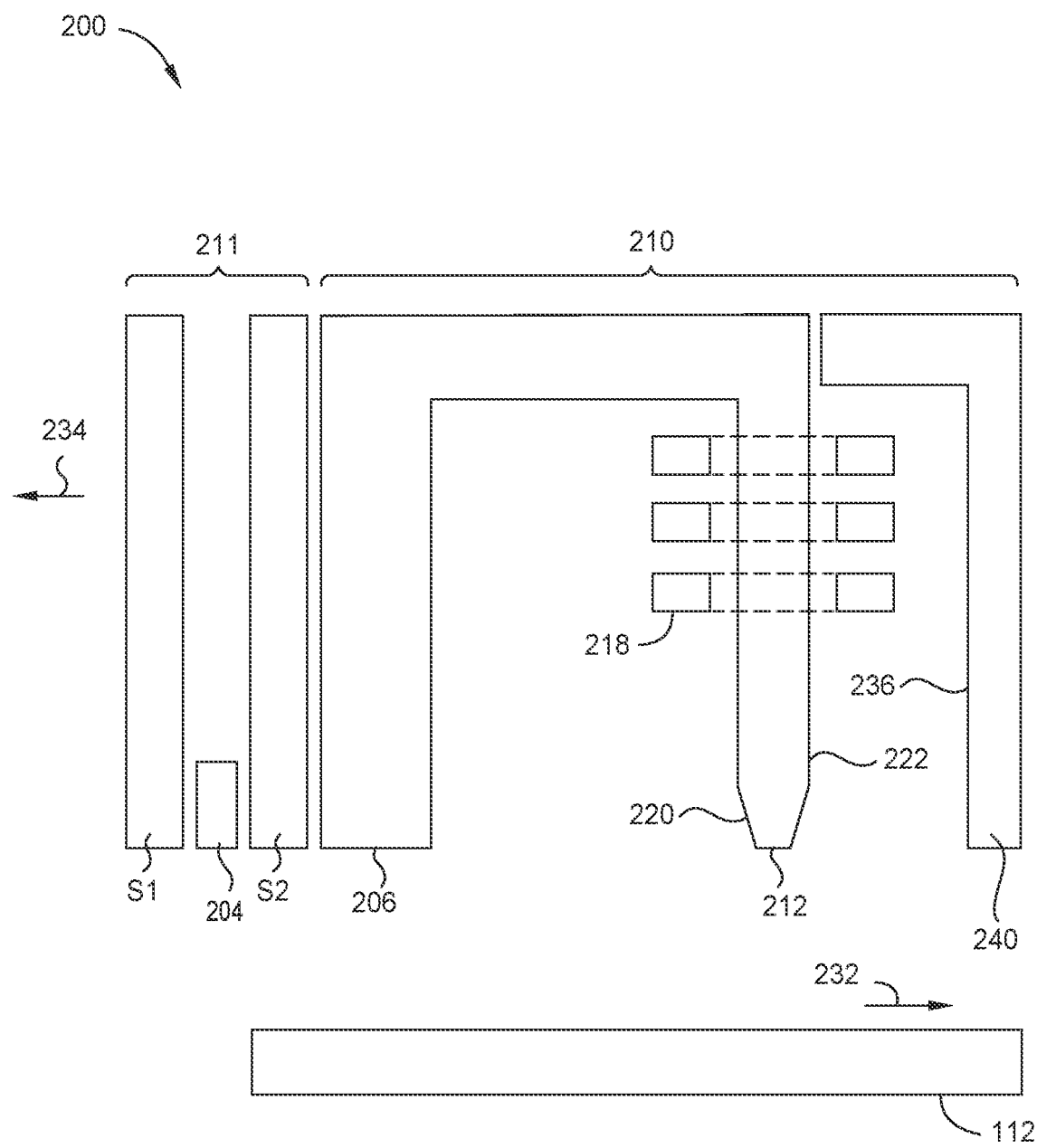
FIG. 2 is a schematic illustration of a cross-sectional side view of a head assembly facing a magnetic storage medium, according to various embodiments.

FIG. 2 is a schematic illustration of a cross-sectional side view of a head assembly 200 facing a magnetic storage medium, such as the magnetic media 112, according to disclosed embodiments. The head assembly 200 may correspond to the magnetic head assembly 121 described in FIG. 1. The head assembly 200 includes a media facing surface (MFS) 212, such as an air bearing surface (ABS), a magnetic write head 210, and a magnetic read head 211. The head assembly 200 is mounted such that the MFS 212 is facing the magnetic media 112. In FIG. 2, the magnetic media 112 moves past the write head 210 in the direction indicated by the arrow 232 and the head assembly 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing element 204 located between MR shields S1 and S2. The magnetic fields of the adjacent magnetized regions in the magnetic media 112 are detectable by the MR (or MTJ) sensing element 204 as the recorded bits.

The write head 210 includes a return pole 206, a main pole 220, a trailing shield 240, and a coil 218 that excites the main pole 220. The coil 218 may have a "pancake" structure which winds around a back-contact between the main pole 220 and the return pole 206, instead of a "helical" structure shown in FIG. 2. A trailing gap (not shown) and a leading gap (not shown) may be in contact with the main pole and a leading shield (not shown) may be in contact with the leading gap.

A recording magnetic field is generated from the main pole 220 and the trailing shield 240 helps making the magnetic field gradient of the main pole 220 steep. The main pole 220 may be a magnetic material such as a FeCo alloy. The main pole 220 may include a trailing surface 222 that may be parallel to a leading surface 236 of the trailing shield 240. The main pole 220 may be a tapered write pole (TWP) with a trailing edge taper (TET) configuration. In one embodiment, the main pole 220 has a saturated magnetization (Ms) of 2.4 Teslas (T) and a thickness of about 300 nanometers (nm). The main pole 220 may comprise ferromagnetic materials, typically alloys of one or more of Co, Fe and Ni. The trailing shield 240 may be a magnetic material such as NiFe alloy. In one embodiment, the trailing shield 240 has an Ms of about 1.2 T to about 1.6 T.

It is to be understood that a "dual free layer (DFL) read head" and a "magnetic read head" may be used interchangeably in the descriptions herein, for exemplary purposes.

Figure 3A:
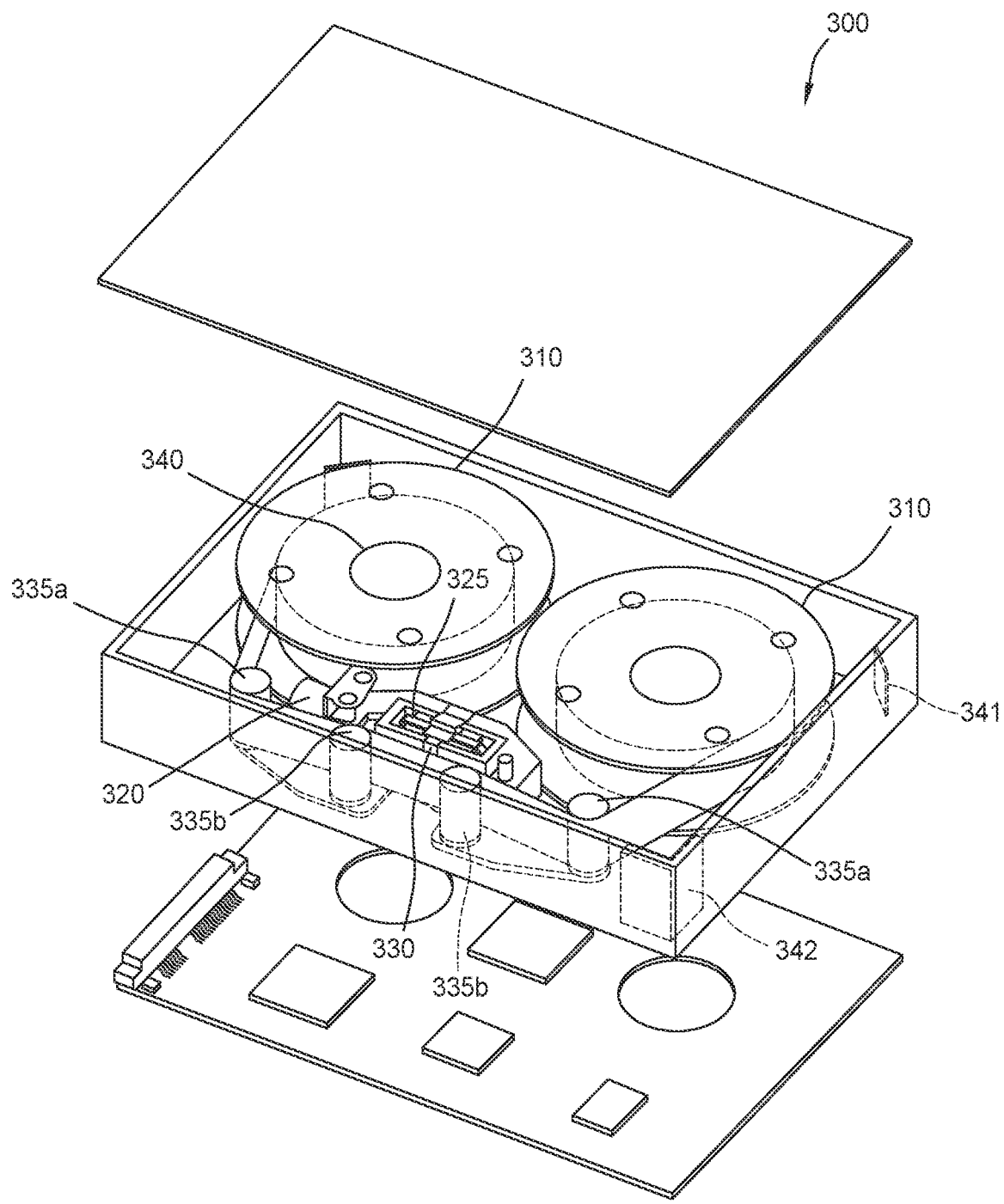
FIGS. 3A-3C illustrate a perspective exploded view, a simplified top down, and side profile view of a tape drive, in accordance with some embodiments.
Figure 3B:
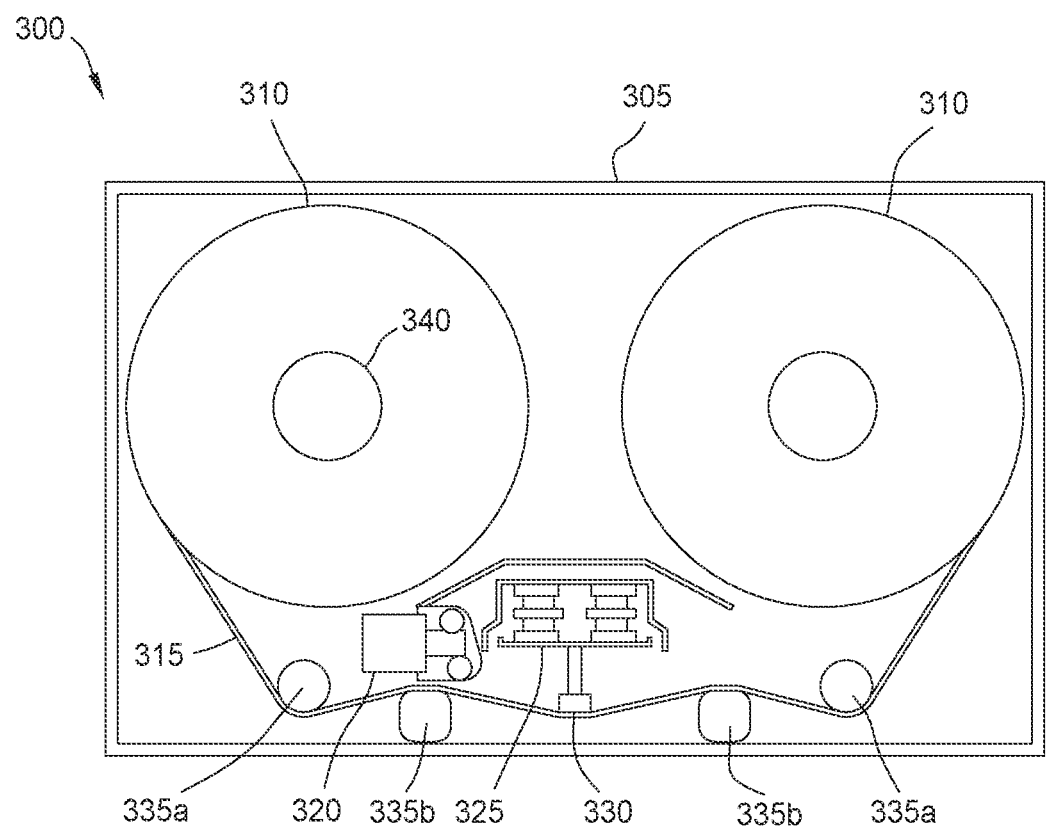
Figure 3C:
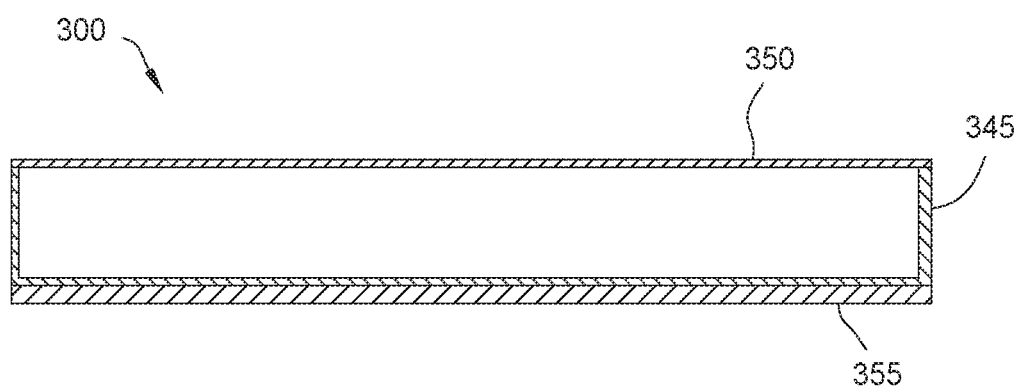

FIGS. 3A-3C illustrate a perspective exploded view of a storage device 300, according to another implementation. The storage device 300 is a magnetic media drive. The storage device 300 will be referred to as the tape drive 300 hereafter. It is noted that while the tape drive is shown as having embedded tape for illustrative purposes, the embodiments of the invention can be applied in various forms of tape drive including a drive where the tape media is insertable such as in a media cartridge. One example is tape drives and media conforming to the LTO standard, and the various drive illustrations shown would be similar to such a drive when the media is fully inserted and engageable for data access.

Focusing on FIG. 3B, for example, the tape embedded drive comprises a casing 305, one or more tape reels 310, one or more motors (e.g., a stepping motor 320 (also known as a stepper motor), a voice coil motor (VCM) 325, etc.) a head assembly 330 with one or more read heads and one or more write heads, and tape guides/rollers 335a, 335b. In the descriptions herein, the term "head assembly" may be referred to as "magnetic recording head", interchangeably, for exemplary purposes. Focusing on FIG. 3C, for example, the tape embedded drive further comprises a printed circuit board assembly (PCBA) 355. In an embodiment, most of the components are within an interior cavity of the casing, except the PCBA 355, which is mounted on an external surface of the casing 305. The same components are illustrated in a perspective view in FIG. 3A. In the descriptions herein, the term "tape" may be referred to as "magnetic media", interchangeably, for exemplary purposes.

In the illustrated embodiments, two tape reels 310 are placed in the interior cavity of the casing 305, with the center of the two tape reels 310 on the same level in the cavity and with the head assembly 330 located in the middle and below the two tape reels 310. Tape reel motors located in the spindles of the tape reels 310 can operate to wind and unwind the tape media 315 in the tape reels 310. Each tape reel 310 may also incorporate a tape folder to help the tape media 315 be neatly wound onto the reel 310. One or more of the tape reels 310 may form a part of a removable cartridge and are not necessarily part of the tape drive 300. In such embodiments, the tape drive 300 may not be a tape embedded drive as it does not have embedded media, the drive 300 may instead be configured to accept and access magnetic media or tape media 315 from an insertable cassette or cartridge (e.g., an LTO drive), where the insertable cassette or cartridge further comprises one or more of the tape reels 310 as well. The tape media 315 may be made via a sputtering process to provide improved areal density. The tape media 315 comprises two surfaces, an oxide side and a substrate side. The oxide side is the surface that can be magnetically manipulated (written to or read from) by one or more read/write heads. The substrate side of the tape media 315 aids in the strength and flexibility of the tape media 315.

Tape media 315 from the tape reels 310 are biased against the guides/rollers 335a, 335b (collectively referred to as guides/rollers 335) and are movably passed along the head assembly 330 by movement of the reels 310. The illustrated embodiment shows four guides/rollers 335a, 335b, with the two guides/rollers 335a furthest away from the head assembly 330 serving to change direction of the tape media 315 and the two guides/rollers 335b closest to the head assembly 330 by pressing the tape media 315 against the head assembly 330.

As shown in FIG. 3A, in some embodiments, the guides/rollers 335 utilize the same structure. In other embodiments, as shown in FIG. 3B, the guides/rollers 335 may have more specialized shapes and differ from each other based on function. Furthermore, a lesser or a greater number of rollers may be used. For example, the two function rollers may be cylindrical in shape, while the two functional guides may be flat-sided (e.g., rectangular prism) or clip shaped with two prongs and the film moving between the prongs of the clip.

The voice coil motor 325 and stepping motor 320 may variably position the tape head(s) transversely with respect to the width of the recording tape. The stepping motor 320 may provide coarse movement, while the voice coil motor 325 may provide finer actuation of the head(s). In an embodiment, servo data may be written to the tape media to aid in more accurate position of the head(s) along the tape media 315.

In addition, the casing 305 comprises one or more particle filters 341 and/or desiccants 342, as illustrated in FIG. 3A, to help maintain the environment in the casing. For example, if the casing is not airtight, the particle filters may be placed where airflow is expected. The particle filters and/or desiccants may be placed in one or more of the corners or any other convenient place away from the moving internal components. For example, the moving reels may generate internal airflow as the tape media winds/unwinds, and the particle filters may be placed within that airflow.

There is a wide variety of possible placements of the internal components of the tape drive 300 within the casing 305. In particular, as the head mechanism is internal to the casing in certain embodiments, the tape media 315 may not be exposed to the outside of the casing 305, such as in conventional tape drives. Thus, the tape media 315 does not need to be routed along the edge of the casing 305 and can be freely routed in more compact and/or otherwise more efficient ways within the casing 305. Similarly, the head(s) 330 and tape reels 310 may be placed in a variety of locations to achieve a more efficient layout, as there are no design requirements to provide external access to these components.

As illustrated in FIG. 3C, the casing 305 comprises a cover 350 and a base 345. The PCBA 355 is attached to the bottom, on an external surface of the casing 305, opposite the cover 350. As the PCBA 355 is made of solid state electronics, environmental issues are less of a concern, so it does not need to be placed inside the casing 305. That leaves room inside casing 305 for other components, particularly, the moving components and the tape media 315 that would benefit from a more protected environment.

In some embodiments, the tape drive 300 is sealed. Sealing can mean the drive is hermetically sealed or simply enclosed without necessarily being airtight. Sealing the drive may be beneficial for tape film winding stability, tape film reliability, and tape head reliability. Desiccant may be used to limit humidity inside the casing 305.

In one embodiment, the cover 350 is used to hermetically seal the tape embedded drive. For example, the drive 300 may be hermetically sealed for environmental control by attaching (e.g., laser welding, adhesive, etc.) the cover 350 to the base 345. The drive 300 may be filled by helium, nitrogen, hydrogen, or any other typically inert gas.

In some embodiments, other components may be added to the tape drive 300. For example, a pre-amp for the heads may be added to the tape embedded drive. The pre-amp may be located on the PCBA 355, in the head assembly 330, or in another location. In general, placing the pre-amp closer to the heads may have a greater effect on the read and write signals in terms of signal-to-noise ratio (SNR). In other embodiments, some of the components may be removed. For example, the filters 341 and/or the desiccant 342 may be left out.

In various embodiments, the drive 300 includes controller integrated circuits (IC) (or more simply "a controller") (e.g., in the form of one or more System on Chip (SoC)), along with other digital and/or analog control circuitry to control the operations of the drive. For example, the controller and other associated control circuitry may control the writing and reading of data to and from the magnetic media, including processing of read/write data signals and any servo-mechanical control of the media and head module. In the description below, various examples related to writing and reading and verifying of written data, as well as control of the tape head and media to achieve the same, may be controlled by the controller. As an example, the controller may be configured to execute firmware instructions for the various same gap verify embodiments described below.

Figure 4A:
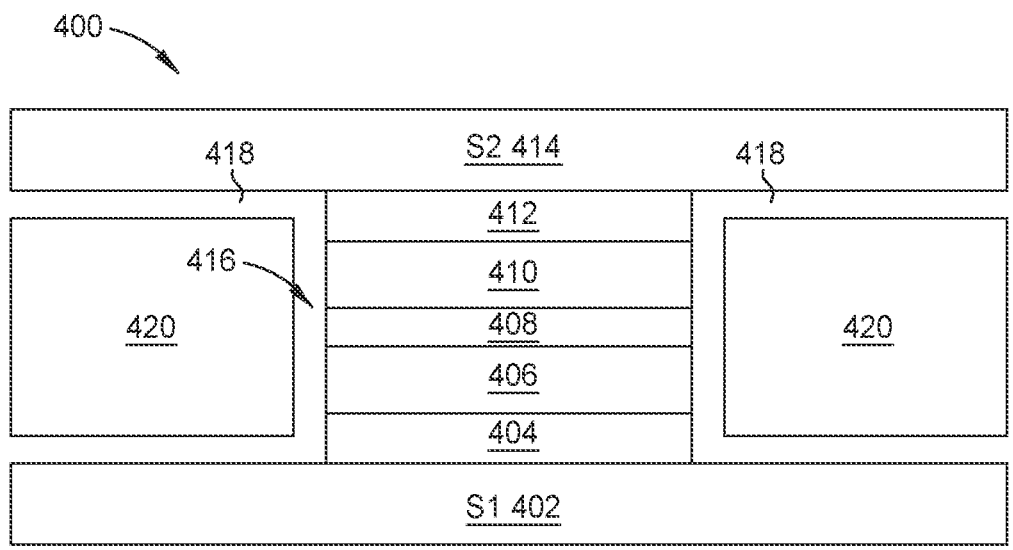
FIGS. 4A4B are schematic illustrations of a magnetic read head, according to disclosed embodiments.
Figure 4B:
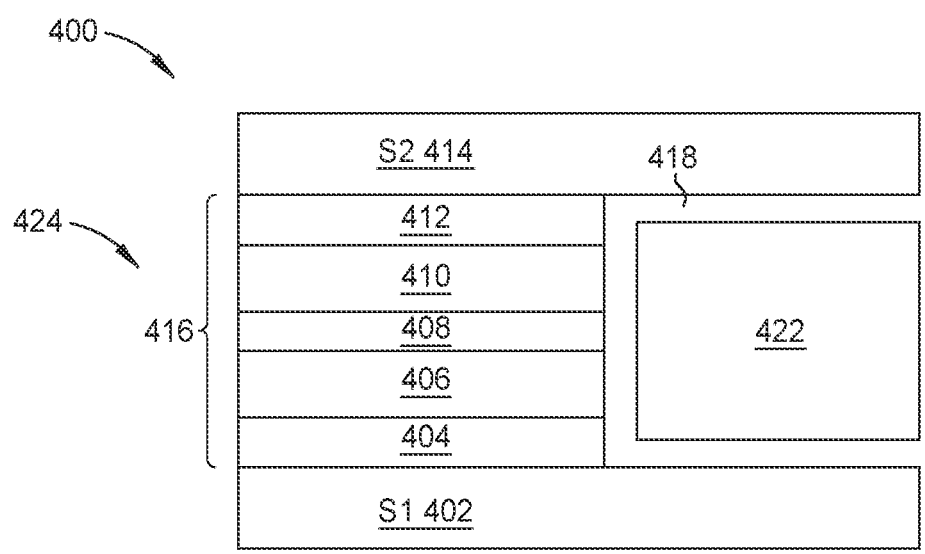

FIG. 4A is a schematic illustration of a magnetic read head 400 shown from a MFS view, according to disclosed embodiments. FIG. 4B is a schematic illustration of the magnetic read head 400 shown from a cross-sectional view, according to disclosed embodiments. The magnetic read head 400 may be within any magnetic media drive, such as the magnetic media drive 100 of FIG. 1 or the magnetic storage device 300 of FIGS. 3A-3B. The magnetic read head 400 comprises a first shield (S1) 402, a seed layer 404 disposed over the S1 402, a first free layer (FL) 406 disposed over the seed layer 404, a barrier layer 408 disposed over the first FL 406, a second FL 410 disposed over the barrier layer 408, a capping layer 412 disposed over the second FL 410, and a second shield (S2) 414 disposed over the capping layer. The seed layer 404, the first FL 406, the barrier layer 408, the second FL 410, and the capping layer 412 are collectively referred to as the sensor 416. In the embodiments discussed herein, the sensor 416 may be referred to as a MTJ stack or a tunnel magneto-resistive (TMR) sensor, interchangeably, for exemplary purposes.

The S1 402 includes a magnetic permeable and electrically conductive material selected from the group that includes NiFe, CoFe, NiFeCo, alloys, and their combinations. The S2 414 includes a magnetic permeable and electrically conductive material selected from the same group of materials as S1 402, or the same material exchange biased by a manganese based antiferromagnet such as IrMn, PtMn, and NiMn, or the combination of the two. The thickness of each of the S1 402 and the S2 414 may individually be between about 10 nm and about 500 nm. The S1 402 and S2 414 are deposited by well-known deposition methods such as electroplating, electroless plating, or sputtering, or their combinations. Additionally, it is to be understood that while NiFe, CoFe, NiFeCo, IrMn, PtMn, and NiMn have been exemplified as the S1 402 and S2 414 materials, other materials are contemplated and the embodiments discussed herein are not limited to NiFe, CoFe, NiFeCo, IrMn, PtMn, and NiMn for the S1 402 and the S2 414.

The seed layer 404 is formed over the S1 402 to magnetically decouple the first FL 406 from the S1 402. The seed layer 404 is deposited by well-known deposition methods such as sputtering. The seed layer 404 includes a material selected from the group that includes tantalum (Ta), ruthenium (Ru), titanium (Ti) and their multilayers or alloys thereof. The seed layer 404 may have a thickness between about 10 Angstroms to about 60 Angstroms. Additionally, it is to be understood that while Ta, Ru, Ti and their multilayers and alloys have been exemplified as the seed layer 404 materials, other materials are contemplated and the embodiments discussed herein are not limited to Ta, Ru, or Ti or their multilayers or alloys for the seed layer 404. For example, suitable materials for the seed layer 404 may also include non-magnetic alloys of Co, Fe, and Ni with added elements such as Hf and Zr. Examples include CoHf and CoZr.

The first FL 406 is formed on the seed layer 404. The first FL 406 may be formed by well-known deposition methods such as sputtering. The first FL 406 includes a $CoFe_xB/CoFe$ multilayer stack. The CoFe layer may have a thickness between about 3 Angstroms to about 10 Angstroms. The $CoFe_xB$ layer may have a thickness between about 30 Angstroms to about 100 Angstroms, where "x" is between about 0 and about 1 (i.e., the layer may have a non-stoichiometric amount of Fe). Additionally, it is to be understood that while $CoFe_xB/CoFe$ has been exemplified as the first FL 406 material, other materials are contemplated and the embodiments discussed herein are not limited to $CoFe_xB/CoFe$ for the first FL 406.

The barrier layer 408 is formed on the first FL 406. The barrier layer 408 includes a material such as magnesium oxide (MgO) with a thickness between about 10 Angstroms to about 20 Angstroms. It is to be understood that while MgO is exemplified as the barrier layer 408, other insulating materials are contemplated and the embodiments discussed herein are not limited to MgO for the barrier layer 408.

The second FL 410 is formed on the barrier layer 408. The second FL 410 may be formed by well-known deposition methods such as sputtering. The second FL 410 includes a $CoFe/CoFe_xB$ multilayer stack. The CoFe layer may have a thickness between about 3 Angstroms to about 10 Angstroms. The $CoFe_xB$ layer may have a thickness between about 30 Angstroms to about 100 Angstroms and "x" between about 0 and about 1 (i.e., the layer may have a non-stoichiometric amount of Fe). Additionally, it is to be understood that while $CoFe/CoFe_xB$ has been exemplified as the second FL 410 material, other materials are contemplated and the embodiments discussed herein are not limited to $CoFe/CoFe_xB$ for the second FL 410. The magnetic moments for the first FL 406 and the second FL 410 may be antiparallel due to the antiparallel biasing from synthetic antiferromagnetic (SAF) soft biases (SBs) or side shields 420 disposed adjacent to both sides of the MFS of the sensor 416.

The capping layer 412 is formed on the second FL 410 to magnetically decouple the second FL 410 from the S2 414. The capping layer 412 may be formed by well-known deposition methods such as sputtering. The capping layer 412 includes a material selected from the group that includes tantalum (Ta), ruthenium (Ru), titanium (Ti), other non-magnetic, electrically conductive materials and their multilayers. The capping layer 412 may have a thickness between about 10 Angstroms to about 100 Angstroms. Additionally, it is to be understood that while Ta, Ru, Ti, and their multilayers have been exemplified as the capping layer 412 materials, other materials are contemplated and the embodiments discussed herein are not limited to Ta, Ru, or Ti or their multilayers for the capping layer 412. For example, suitable materials for the capping layer 412 may also include non-magnetic alloys of Co, Fe, and Ni with added elements such as Hf and Zr. Examples include CoHf and CoZr.

The magnetic read head 400 further comprises side shields 420, or soft bias structures 420, disposed adjacent to the sensor 416. The side shields or soft bias structures 420 may comprise multiple layers of nickel (Ni) iron (Fe), such as $Ni_{80}Fe_{20}$ or $Ni_{45}Fe_{55}$, for example, with enhanced anisotropy to provide a soft bias field to the sensor 416. The anisotropy of the side shields or soft bias structures 420 is enhanced through the fabrication method of the side shields 420, as discussed further below. A rear bias (RB) structure 422 is disposed behind the sensor 416 recessed from the MFS 424, as shown in FIG. 4B. In some embodiments, the RB structure 422 comprises the same material as the side shields 420. In other embodiments, the RB structure 422 provides a hard bias field to the sensor 416.

One or more insulation layers 418 fills in the space between the S1 402, the sensor 416, the side shields 420, the RB structure 422, and the S2 414. As such, insulation layers 418 are disposed between the S1 402 and the S2 414, between the sensor 416 and the side shields 420, and between the sensor 416 and the side shields 420. Suitable materials for the insulation layers 418 include dielectric materials such as aluminum oxide, magnesium oxide, silicon oxide, silicon nitride, and their multilayers. The insulation layers 418 may be formed by well-known deposition methods such as sputtering and atomic layer chemical vapor deposition. The insulation layers 418 may have a thickness between about 10 Angstroms and about 40 Angstroms.

Figure 5A:
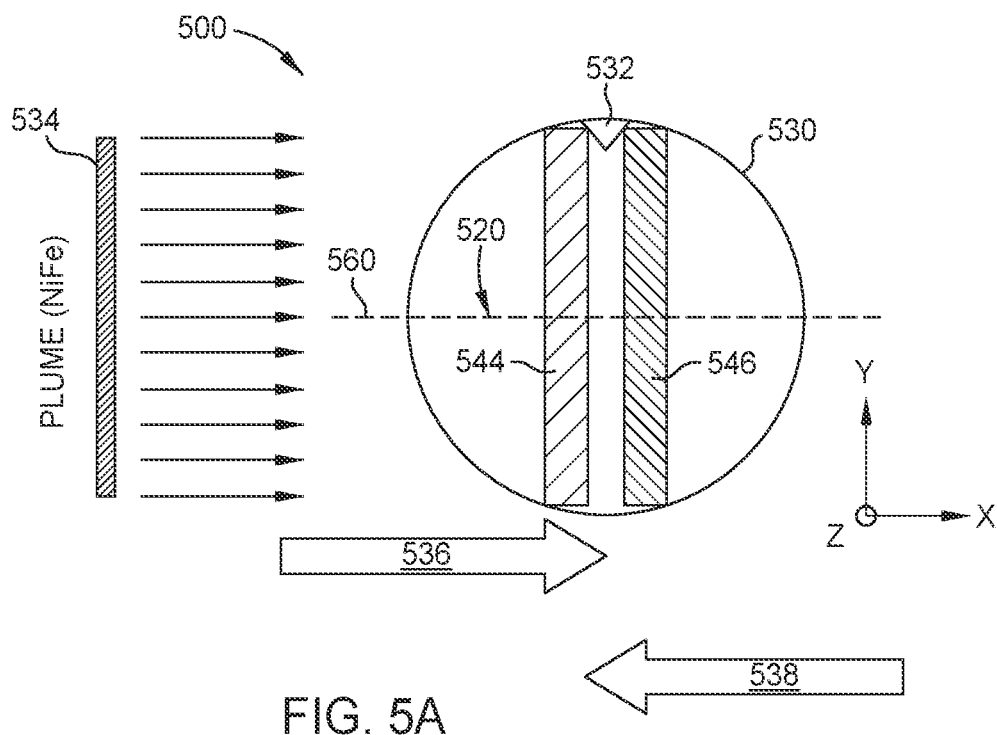
FIGS. 5A-5C illustrate a schematic first deposition technique for forming the side shields of the magnetic recording head of FIGS. 4A-4B, according to one embodiment.
Figure 5B:
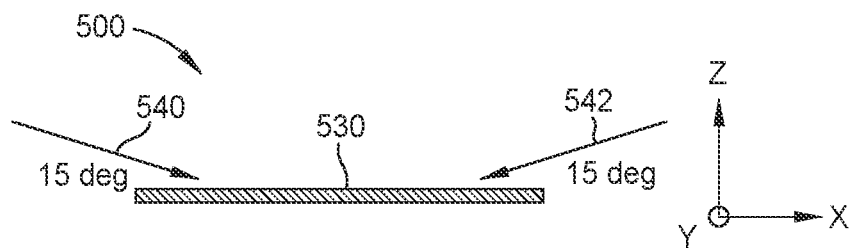
Figure 5C:
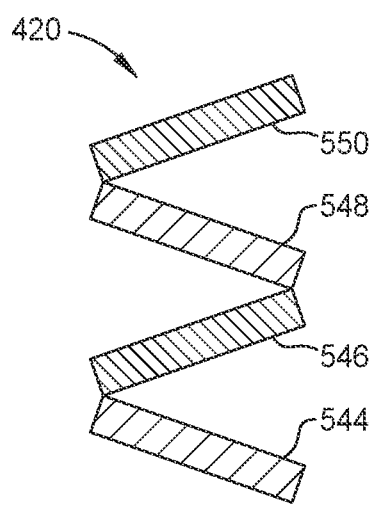

FIGS. 5A-5B illustrate a schematic first deposition technique 500 for forming the side shields or soft bias structures 420 comprising a NiFe film of FIGS. 4A-4B, according to one embodiment. FIG. 5B illustrates the grain structure of the side shields or soft bias structures 420 comprising a NiFe film formed using the deposition technique of FIGS. 5A-5B. FIG. 5A illustrates a top view of a wafer 530 or substrate on which the side shields or soft bias structures 420 comprising a NiFe film is formed, and FIG. 5B illustrates a side view of the wafer 530 or substrate. FIG. 5C illustrates a NiFe film formed using the first deposition technique 500, according to one embodiment. The soft bias structures or soft bias structures 420 may comprise multiple layers of nickel (Ni) iron (Fe), such as $Ni_{80}Fe_{20}$ or $Ni_{45}Fe_{55}$, for example, with enhanced anisotropy to provide a soft bias field to the sensor 416. The first deposition technique 500 may be used to form the RB structure 422 of FIGS. 4A-4B.

In the first deposition technique 500, the wafer 530 moves in a first direction 536 (i.e., the x-direction) and a second direction 538 (i.e., the -x-direction) opposite the first direction 536 along a central axis 560 under an incoming NiFe plume 534 (e.g., a cluster of NiFe atoms). The second direction 538 is opposite the first direction 536. As the wafer 530 moves in the first direction 536 under the NiFe plume 534, a first NiFe layer 544 of the side shields 420 is deposited at a first angle 540 with respect to the wafer 530. In general, the NiFe plume 534 can be viewed as a cluster of NiFe atoms at any given time reaching the surface of the wafer 530. The NiFe plume 534 has density distribution, but with a constant incoming direction with respect to the surface of the wafer 530. The special and angular relationship between wafer 530 and the NiFe plume 534 are defined by the relative position of a sputter target, ion source, and the wafer 530.

As shown in FIG. 5B, the first angle 540 is in the x- and -z-directions. The first angle 540 is between about 5° to about 30°, such as about 15°. Upon depositing the first NiFe layer 544, the wafer 530 moves in the second direction 538 under the NiFe plume 534 to deposit a second layer 546 of the side shields 420 on and in contact with the first layer 544. The second layer 546 is deposited at a second angle 542 with respect to the wafer 530. As shown in FIG. 5B, the second angle 542 is in the -x- and -z-directions. The second angle 542 is between about 5° to about 30°, such as about 15°. Since the first and second NiFe layers 544, 546 are deposited by moving the wafer 530 in two different directions, 536, 538, the first angle 540 and the second angle 542 differ from one another by about 170° to about 120°.

While the first and second layers 544, 546 are shown side by side in FIG. 5A, the first and second layers 544, 546 are disposed on top of one another, like shown in FIG. 5C. Furthermore, the first angle 540 and the second angle 542 may be the same, or the first angle 540 and the second angle 542 may be different. The wafer 530 comprises a notch 532 to ensure proper alignment of the NiFe layers 544, 546, 548, 550 being deposited. The notch 532 is disposed perpendicular to the NiFe plume 534 (e.g., in the 12 o'clock or 6 o'clock position).

Upon depositing the second NiFe layer 546, the first deposition technique 500 then begins again, with the wafer 530 moving in the first direction 536 under the NiFe plume 534 to deposit a third layer 548 of the side shields 420 on and in contact with the second layer 546 at the first angle 540. The wafer 530 then moves in the second direction 538 under the NiFe plume 534 to deposit a fourth layer 550 of the side shields 420 on and in contact with the third layer 548 at the second angle 542. While FIG. 5C shows four NiFe layers 544, 546, 548, and 550, the first deposition technique 500 may repeat any number of times, and as such, the side shields 420 may comprise any number of NiFe layers, such as between two NiFe layers to 300 NiFe layers, or more.

Utilizing the NiFe plume 534 to form the first NiFe layer 544 is a physical sputtering process, where the incoming energetic Ar ions from an ion source are striking a NiFe target surface (not shown). By means of momentum transfer, the target material of NiFe is being "knocked" out of the NiFe target surface and forming a cluster stream of NiFe atoms, referred to herein as the NiFe plume 534. The NiFe plume 534 is directed toward the wafer 530 with a general direction determined by the relative position of the ion source (i.e., Ar+ incoming direction) and the NiFe target surface. The surface of the wafer 530 relative to the incoming NiFe plume 534 direction determines how the NiFe atoms arrive at the surface of the wafer 530, and the wafer 530 is placed to allow for the NiFe plume 534 to arrive at a glancing angle. By alternating the incoming NiFe plume 534 direction with respect to the wafer 530 either from the left- or right-hand side, the incoming NiFe plume 534 direction is manipulated to form the first NiFe layers 544, 546, 548, 550 comprising NiFe atoms within the film thickness direction of the first angle 540 of the second angle 542.

By moving the wafer 530 in the first and second directions 536, 538 to deposit the NiFe layers 544, 546, 548, and 550 at alternating angles 540, 542, the NiFe film of the side shields 420 has alternating NiFe grains. Each NiFe grain is needle-like in shape and angled in either the first angle 540 or the second angle 542, which enables the side shields 420 to have sufficient shape anisotropy to provide longitudinal magnetic field stability to the bias the sensor 416. As a result, the NiFe layers 544, 546, 548, and 550 have weak magnetic coupling to give rise to high coercivity and anisotropy.

FIGS. 6A-7D illustrate a schematic second deposition technique 600 for forming the side shields or soft bias structures 420 comprising a NiFe film of FIGS. 4A-4B, according to another embodiment. FIGS. 6A-6D illustrate top views of a wafer 530 or substrate on which the side shields or soft bias structures 420 comprising a NiFe film is formed, and FIGS. 7A-7D illustrate side views of the wafer 530 or substrate. FIG. 6A is the top view of FIG. 7A showing a first NiFe layer 544 being deposited, FIG. 6B is the top view of FIG. 7B showing a second NiFe layer 546 being deposited, FIG. 6C is the top view of FIG. 7C showing a third NiFe layer 548 being deposited, and FIG. 6D is the top view of FIG. 7D showing a fourth NiFe layer 550 being deposited. The soft bias structures or soft bias structures 420 may comprise multiple layers of NiFe, such as $Ni_{80}Fe_{20}$ or $Ni_{45}Fe_{55}$, for example, with enhanced anisotropy to provide a soft bias field to the sensor 416. The second deposition technique 600 may be used to form the RB structure 422 of FIGS. 4A-4B.

The second deposition technique 600 of FIGS. 6A-7D is similar to the first deposition technique 500 of FIGS. 5A-5B; however, the wafer 530 does not move in the first and second directions 536, 538 in the second deposition technique 600. Instead, the wafer 530 rotates about 180° about the y-axis before each NiFe layer 544, 546, 548, and 550 is deposited, and the wafer 530 is stationary when the NiFe layers 544, 546, 548, and 550 are being deposited. While the second deposition technique 600 of FIGS. 6A-7D shows four NiFe layers 544, 546, 548, and 550, the second deposition technique 600 may repeat any number of times, and as such, the side shields 420 may comprise any number of NiFe layers, such as between two NiFe layers to 300 NiFe layers, or more.

As shown in FIGS. 6A and 7A, the first NiFe layer 544 is deposited when the notch 532 is disposed in a first position (e.g., 12 o'clock). The NiFe plume 534 is disposed at a first angle 640 with respect to the wafer 530 when forming the first NiFe layer 544. The first angle 640 is in the x- and −z-directions. The first angle 640 is between about 5° to about 30°, such as about 15°. In FIGS. 6B and 7B, the wafer 530 rotates 180° to a second position 654 (e.g., 6 o'clock) before depositing the second NiFe layer 546 over the first NiFe layer 544. The NiFe plume 534 is disposed at a second angle 642 with respect to the wafer 530 when forming the second NiFe layer 546. The second angle 642 is in the −x- and −z-directions. The second angle 642 is between about 5° to about 30°, such as about 25°. In some embodiments, the first and second angles 640, 642 are different. In other embodiments, the first and second angles 640, 642 are the same. Since the first and second NiFe layers 544, 546 are deposited by rotating the wafer 530 180° about the y-axis, the first angle 640 and the second angle 642 differ from one another by about 165° to about 110°.

The second deposition technique 600 then repeats one or more times. FIGS. 6C and 7C illustrate the third NiFe layer 548 being deposited after the wafer 530 rotates 180° back to the first position 652. The third NiFe layer 548 is deposited at the first angle 640 on the second NiFe layer 546. FIGS. 6D and 7D illustrate the fourth NiFe layer 550 being deposited after the wafer 530 rotates 180° to the second position 654. The fourth NiFe layer 550 is deposited at the second angle 642 on the third NiFe layer 548. Once the desired number of NiFe layer is reached, for example, like shown in FIG. 7D, the second deposition technique 600 ends, resulting with a side shields 420 similar to that shown in FIG. 5C.

By rotating the wafer 530 180° about the y-axis between the first and second positions 652, 654 to deposit the NiFe layers 544, 546, 548, and 550, the NiFe film of the side shields 420 has alternating NiFe grains. Each NiFe grain is needle-like in shape and angled in either the first angle 640 or the second angle 642, which enables the side shields 420 to have sufficient shape anisotropy to provide longitudinal magnetic field stability to the bias the sensor 416. The alternating incoming direction of the NiFe plume 534 weakens the ferromagnetic coupling inside the NiFe film of the side shields 420 along the thickness direction (e.g., the x-direction), resulting in the high coercivity and anisotropy properties of the NiFe film of the side shields 420.

By forming soft bias structures using the first deposition technique (i.e., moving a wafer in anti-parallel directions to deposit NiFe layers having alternating grain structures) or the second deposition technique (i.e., rotating the wafer 180° to deposit NiFe layers having alternating grain structures) with the alternating incoming direction of the NiFe plume, the soft bias structures have sufficient shape anisotropy to provide longitudinal magnetic field stability to the bias the sensor. Furthermore, the soft bias structures having alternating grain structures between the various NiFe layers, and the alternating incoming direction of the NiFe plume weakening the ferromagnetic coupling inside the NiFe film of the side shields along the thickness direction, results in the soft bias structures having a high coercivity and a high anisotropy.

In one embodiment, a method of forming soft bias structures comprises moving a wafer a first direction under a plume of NiFe to deposit a first NiFe layer on a surface of the wafer, the first NiFe layer being deposited at a first angle with respect to the surface of the wafer, and moving the wafer a second direction opposite the first direction under the plume of NiFe to deposit a second NiFe layer on the first NiFe layer, the second NiFe layer being deposited at a second angle with respect to the surface of the wafer.

The method further comprises repeating moving the wafer under the plume of NiFe alternatingly in the first direction and the second direction one or more times to deposit one or more additional NiFe layers on the second NiFe layers. The first angle and the second angle are between about 5° to about 30° with respect to the surface of the wafer. The first angle and the second angle are the same. The first and second NiFe layers each comprises $Ni_{80}Fe_{20}$ or $Ni_{45}Fe_{55}$. The first NiFe layer and the second NiFe layer have different grain structures. The soft bias structures are formed adjacent to a magnetic read sensor.

In another embodiment, a method of forming soft bias structures comprises (a) rotating and aligning a wafer to a first position, (b) depositing a first NiFe layer having a first grain structure on a surface of the wafer while the wafer is in the first position, the first NiFe layer being deposited at first angle with respect to the surface of the wafer, (c) rotating and aligning the wafer to a second positon, (d) depositing a second NiFe layer having a second grain structure on the first NiFe layer while the wafer is in the second position, the second NiFe layer being deposited at a second angle with respect to the surface of the wafer, and (e) repeating (a)-(d) one or more times to deposit one or more additional layers having alternating first and second grain structures on the second NiFe layer.

The wafer rotates about 180° between the first position and the second position. The first angle is between about 5° to about 30° with respect to the surface of the wafer. The second angle is between about 10° to about 50° with respect to the surface of the wafer. The first angle is smaller than the second angle. The first angle is about 15° and the second angle is about 25°. The soft bias structures are formed adjacent to a magnetic read sensor.

In yet another embodiment, a magnetic sensor comprises soft bias structures, wherein: the soft bias structures comprise one or more pairs of a first NiFe layer and a second NiFe layer disposed on the first NiFe layer, the first NiFe layer is deposited at a first angle with respect to a wafer surface from a first direction and has a first grain structure, the second NiFe layer is deposited at a second angle with respect to the wafer surface from a second direction and has a second grain structure different than the first grain structure, and the first direction is different than the second direction.

The first direction is anti-parallel to the second direction. The first direction is about 180° different than the second direction. The first angle is between about 5° to about 30° with respect to the surface of the wafer. The second angle is between about 10° to about 50° with respect to the surface of the wafer. The first angle and the second angle are the same.

While the foregoing is directed to embodiments of the present disclosure, other and further embodiments of the disclosure may be devised without departing from the basic scope thereof, and the scope thereof is determined by the claims that follow.

What is claimed is:

1. A method of forming soft bias structures, comprising:
    moving a wafer a first direction under a plume of NiFe to deposit a first NiFe layer on a surface of the wafer, the first NiFe layer being deposited at a first angle with respect to the surface of the wafer; and
    moving the wafer a second direction opposite the first direction under the plume of NiFe to deposit a second NiFe layer on the first NiFe layer, the second NiFe layer being deposited at a second angle with respect to the surface of the wafer.

2. The method of claim 1, further comprising:
    repeating moving the wafer under the plume of NiFe alternatingly in the first direction and the second direction one or more times to deposit one or more additional NiFe layers on the second NiFe layers.

3. The method of claim 1, wherein the first angle and the second angle are between about 5° to about 30° with respect to the surface of the wafer.

4. The method of claim 1, wherein the first angle and the second angle are the same.

5. The method of claim 1, wherein the first and second NiFe layers each comprises $Ni_{80}Fe_{20}$ or $Ni_{45}Fe_{55}$.

6. The method of claim 1, wherein the first NiFe layer and the second NiFe layer have different grain structures.

7. The method of claim 1, wherein the soft bias structures are formed adjacent to a magnetic read sensor.

* * * * *